US009143116B2

(12) United States Patent
Hsieh et al.

(10) Patent No.: US 9,143,116 B2
(45) Date of Patent: Sep. 22, 2015

(54) SHORT CURRENT-FREE EFFECTIVE CAPACITANCE TEST CIRCUIT AND METHOD

(71) Applicant: TAIWAN SEMICONDUCTOR MANUFACTURING COMPANY, LTD., Hsinchu (TW)

(72) Inventors: Chung-Peng Hsieh, New Taipei (TW); Chung-Ting Lu, Kaohsiung (TW); Chung-Chieh Yang, Zhubei (TW); Chih-Chiang Chang, Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 7 days.

(21) Appl. No.: 14/051,593

(22) Filed: Oct. 11, 2013

(65) Prior Publication Data

US 2015/0102861 A1  Apr. 16, 2015

(51) Int. Cl.
*H03K 3/03* (2006.01)
*G06F 1/10* (2006.01)

(52) U.S. Cl.
CPC ............... *H03K 3/0315* (2013.01); *G06F 1/10* (2013.01)

(58) Field of Classification Search
CPC . H03K 3/0315; G01R 31/31924; G01R 27/26
USPC ........ 716/136; 331/57; 324/762.01; 327/291, 327/276
See application file for complete search history.

(56) References Cited

U.S. PATENT DOCUMENTS 8,154,309 B2 *  4/2012  Agarwal et al. ............... 324/681

* cited by examiner

*Primary Examiner* — Arnold Kinkead
(74) *Attorney, Agent, or Firm* — Lowe Hauptman & Ham, LLP

(57) ABSTRACT

A method of determining an effective capacitance of a ring oscillator free of short current. The method comprises determining a frequency of an oscillator signal communicated from a ring oscillator to an inverter via a first communication path. The first communication path has connectivity to a first voltage source, a ground path and the inverter. The first communication path is divided into a second communication path and a third communication path. The method further comprises determining a voltage line current. The method additionally comprises determining an effective capacitance of the ring oscillator based on a first voltage of the first voltage source, the voltage line current and the frequency of the oscillator signal communicated to the inverter along the third communication path.

20 Claims, 7 Drawing Sheets

SHORT CURRENT-FREE EFFECTIVE CAPACITANCE TEST CIRCUIT AND METHOD

BACKGROUND

Device manufacturers are continually challenged to deliver value and convenience to consumers by, for example, providing integrated circuits that offer quality performance. Certain performance metrics are often determined to assess device performance.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry, various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Circuit performance metrics such as capacitance of various circuit elements are often determined to assess device performance. Many capacitance tests include a short current (i.e., a current to a ground path) if determining capacitance of a circuit element such as, for example, a ring oscillator. Some capacitance tests derive an effective capacitance of a ring oscillator from the equation:

$$I_{vdd} = C_{eff} \cdot V_{dd} \cdot F_{RO} \qquad [\text{eq. 1}]$$

where $I_{vdd}$ is the current output by a voltage source, $C_{eff}$ is the effective capacitance of the ring oscillator, $V_{dd}$ is the voltage output by the voltage source, and $F_{RO}$ is a frequency of a signal output by the ring oscillator.

The current $I_{vdd}$ output by the voltage source is determinable, but only some of the current $I_{vdd}$ transfers to a downstream circuit element because a portion of current $I_{vdd}$ is lost to a ground path. As such, common capacitance derivations, such as that which employ eq. 1, are error prone because eq. 1 includes the lost short current in the capacitance value derivation. Errors in capacitance determinations based on current values that include short current are significant, often deviating from an actual capacitance by at least 10%.

Figure 1:
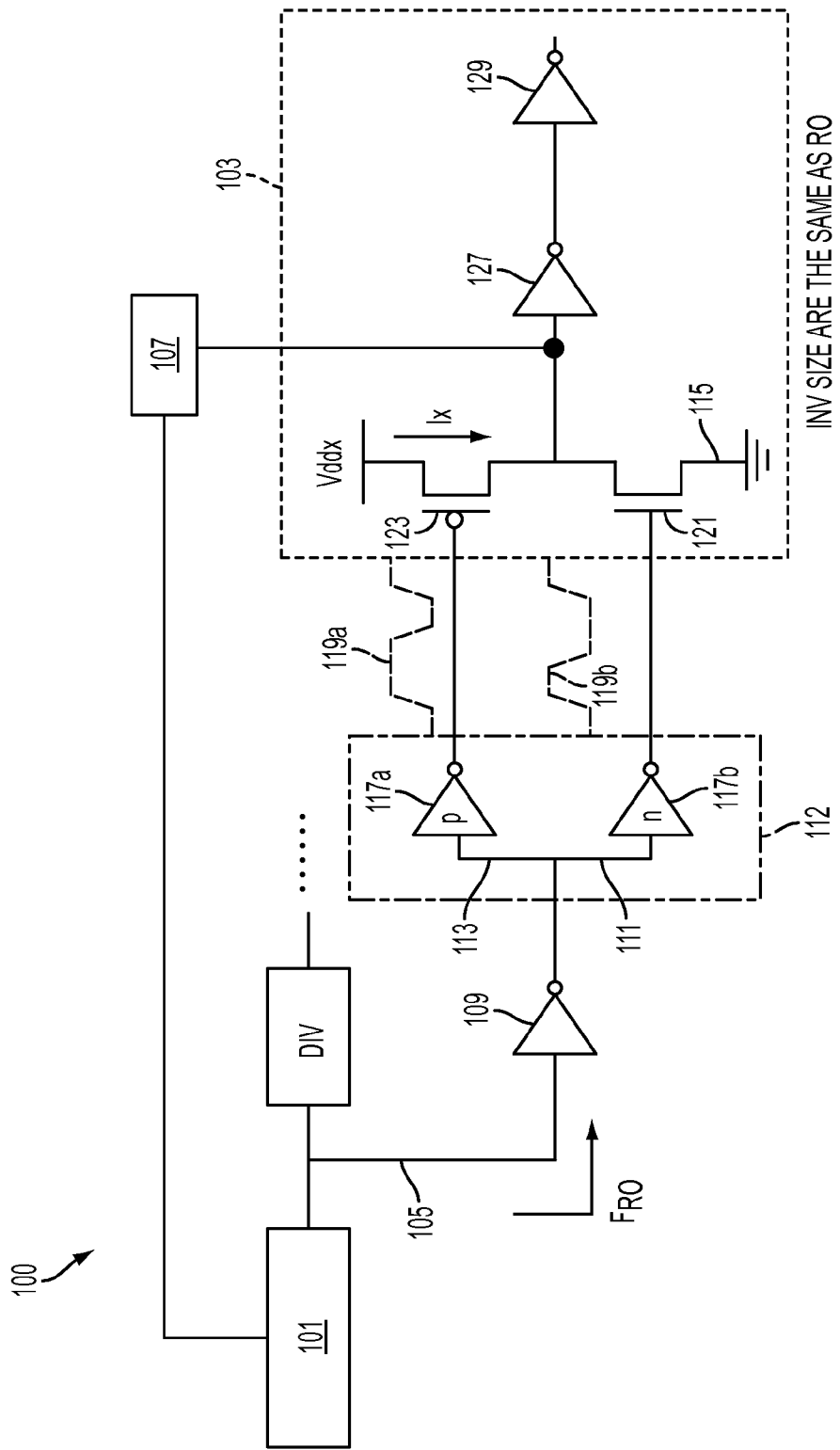
FIG. 1 is a diagram of a test circuit configured to determine an effective capacitance of a ring oscillator, in accordance with one or more embodiments.

FIG. 1 is a diagram of a test circuit 100 configured to determine an effective capacitance of a ring oscillator, in accordance with one or more embodiments. The test circuit 100 is configured to exclude short current from a capacitance determination of one or more circuit elements.

The test circuit 100 comprises a ring oscillator 101 configured to output an oscillator signal having a frequency $F_{RO}$ to an inverter 103 along a first communication path 105. A processor 107 is configured to determine the frequency of the oscillator signal. In some embodiments, the processor 107 is configured to cause the ring oscillator 101 to communicate the oscillator signal. The first communication path 105 includes a first path inverter 109 between the ring oscillator 101 and the inverter 103. In some embodiments, the first communication path 105 optionally lacks the first path inverter 109 between the ring oscillator 101 and the inverter 103. The test circuit 100 also comprises a second communication path 111 and a third communication path 113. The second communication path 111 and the third communication path 113 are separate communication paths that are divisions of the first communication path 105. The second communication path 111 and the third communication path 113 are in parallel to each other and in series with the first communication path 105.

The second communication path 111 has connectivity to a first voltage source having a voltage Vddx, a first ground path 115 and the inverter 103. The third communication path 113 has connectivity to the first voltage source having the voltage Vddx, the first ground path 115 and the inverter 103.

The test circuit 100 also includes a pair of inverters, p-inverter 117a and n-inverter 117b (collectively referred to as inverter pair 117). P-inverter 117a is part of the third communication path 113 and n-inverter 117b is part of the second communication path 111. The inverter pair 117 is configured to generate a non-overlapping clock signal 119 to facilitate communicating the oscillator signal along the second communication path 111 and the third communication path 113. The p-inverter 117a generates a first clock signal 119a that is in-phase with the oscillator signal. First clock signal 119a is communicated to the inverter 103 along the third communication path 113. The n-inverter 117b generates a second clock signal 119b out-of-phase with the first clock signal 119a. The second clock signal 119b is communicated along the second communication path 111.

The processor 107 is configured to determine a first current Ix associated with the third communication path 113 and determine an effective capacitance of the ring oscillator 101 based on the frequency $F_{RO}$ of the oscillator signal, the first voltage Vddx of the first voltage source and the first current Ix communicated to the inverter 103 along the third communication path 113. The processor 107 is configured to differentiate between the oscillator signal communicated along the third communication path 113, based on the in-phase first clock signal 119a communicated along the third communication path 113, and the out-of-phase second clock signal 119b communicated along the second communication path 111. Because the processor 107 differentiates the first clock signal 119a and the second clock signal 119b, the determined effective capacitance does not include current lost to the first ground path 115. In at least one embodiment, the determined effective capacitance does not include any current that is lost to the first ground path 115.

In some embodiments, processor 107 is configured to determine the effective capacitance of the ring oscillator 101 excluding a short current based on a relationship:

$$\text{Ceff}=Ix/Vddx \cdot F_{RO}. \quad \text{[eq. 2]}$$

Figure 7:
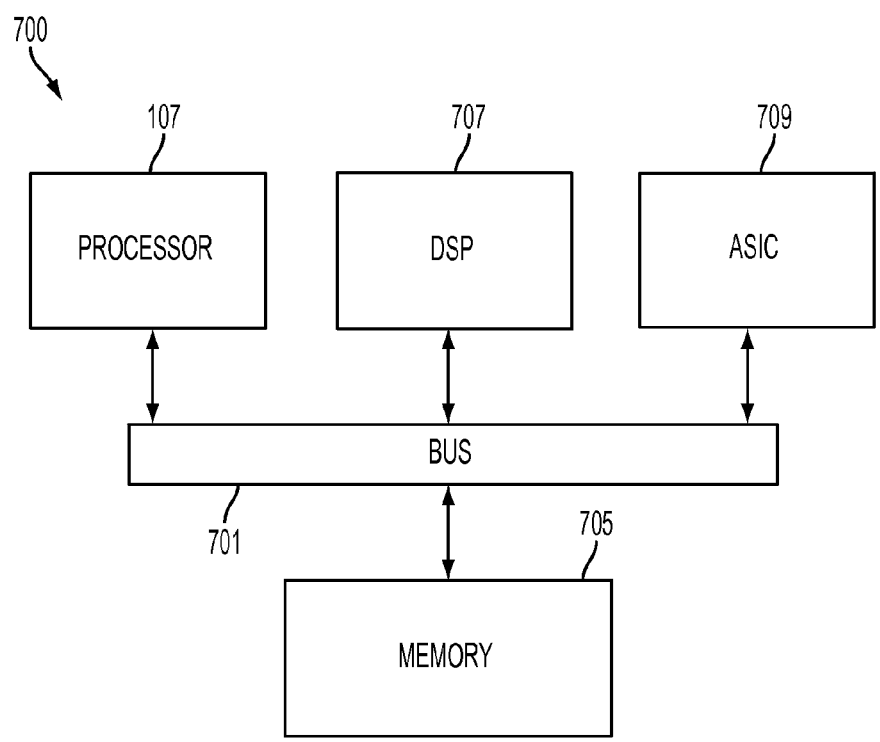
FIG. 7 is a diagram of a chip set used to implement one or more embodiments.

In eq. 2, Ix is the current associated with the third communication path, Vddx is the voltage and $F_{RO}$ is the frequency of the oscillator signal. In at least one embodiment, processor 107 is implemented as a component of a chip set including the processor 107 and a memory as shown in FIG. 7. In some embodiments, the inverter 103 is the same size as the ring oscillator 101. The inverter 103 includes a first NMOS transistor 121 and a first PMOS transistor 123. The inverter 103 includes a first downstream inverter 127, and optionally a second downstream inverter 129. In at least one embodiment, the first and second downstream inverters 127, 129 are optional components.

In some embodiments, the processor 107 is configured to determine an input capacitance of the first PMOS transistor 123. The input capacitance of the first PMOS transistor 123 is based, for example, on the frequency $F_{RO}$ of the oscillator signal, the first voltage Vddx and the first current Ix communicated to the inverter 103 along the third communication path 113.

Figure 2:
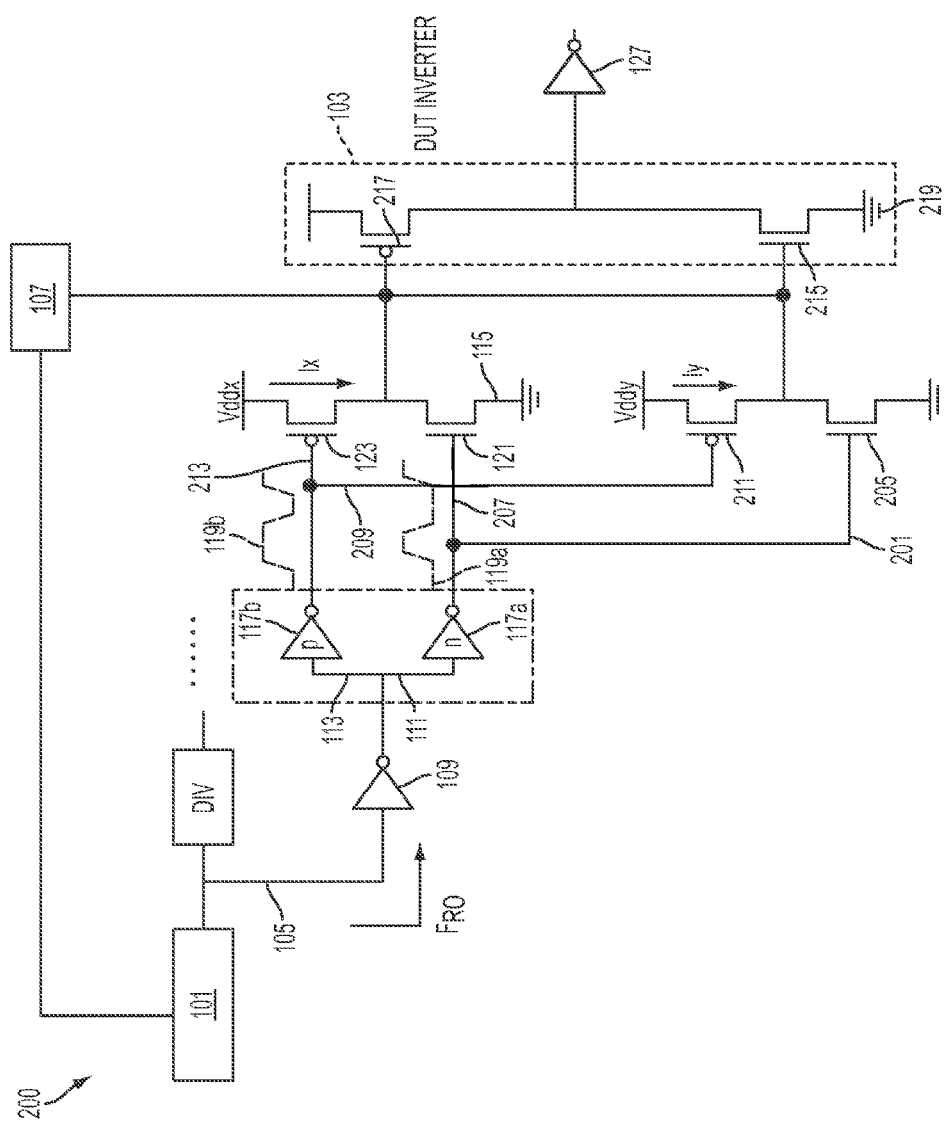
FIG. 2 is a diagram of a test circuit configured to determine an effective capacitance of a ring oscillator, an input capacitance of a PMOS transistor and an input capacitance of an NMOS transistor, in accordance with one or more embodiments.

FIG. 2 is a diagram of a test circuit 200 configured to determine an effective capacitance of the ring oscillator 101, an input capacitance of a PMOS transistor 217 and an input capacitance of an NMOS transistor 215, in accordance with one or more embodiments. The test circuit 200 is an extension of the test circuit 100 including many of the features of test circuit 100. The inverter 103 in the test circuit 200 is a device under test inverter configured to facilitate determining a capacitance value associated with one or more devices in addition to the effective capacitance of the ring oscillator 101.

In some embodiments, the test circuit 200 includes a fourth communication path 201 having connectivity to a second voltage source having a second voltage Vddy, a second ground path 203 and the inverter 103 through a second NMOS transistor 205.

The test circuit 200 also includes a fifth communication path 207 having connectivity to the first voltage source having the first voltage Vddx, the first ground path 115 and the inverter 103 through the first NMOS transistor 121. The fourth communication path 201 and the fifth communication path 207 are divisions of the second communication path 111.

In some embodiments, the test circuit 200 includes a sixth communication path 209 having connectivity to the second voltage source having the second voltage Vddy, the second ground path 203 and the inverter 103 through a second PMOS transistor 211. In some embodiments, the sixth communication path 209 excludes connectivity to the first ground path 115 and the second ground path 203. The test circuit 200 also includes a seventh communication path 213 having connectivity to the first voltage source having the first voltage Vddx, the first ground path 115 and the inverter 103 through the first PMOS transistor 123. In some embodiments, the seventh communication path 213 excludes connectivity to the first ground path 115 and the second ground path 203. The sixth communication path 209 and the seventh communication path 213 are divisions of the third communication path 113.

In one or more embodiments, the inverter 103 comprises third NMOS transistor 215, third PMOS transistor 217 and a third ground path 219. In some embodiments, the inverter 103 has connectivity to a downstream inverter 127.

In the test circuit 200, the processor 107 is configured to determine a second current Iy associated with the sixth communication path 209 and determine an input capacitance of the third NMOS transistor 215 based on the frequency $F_{RO}$, the second voltage Vddy and the second current Iy communicated to the third NMOS transistor 215 along the sixth communication path 209. The processor 107 is also configured to determine the input capacitance of the third PMOS transistor 217 based on the frequency $F_{RO}$, the first voltage Vddx and the first current Ix communicated to the third PMOS transistor 217 along the seventh communication path 213.

In some embodiments, the third PMOS transistor 217 input capacitance and third NMOS transistor 215 input capacitance are determined simultaneously. In one or more embodiments, the third PMOS transistor 217 input capacitance and the third NMOS transistor 215 input capacitance are determined individually.

Figure 3:
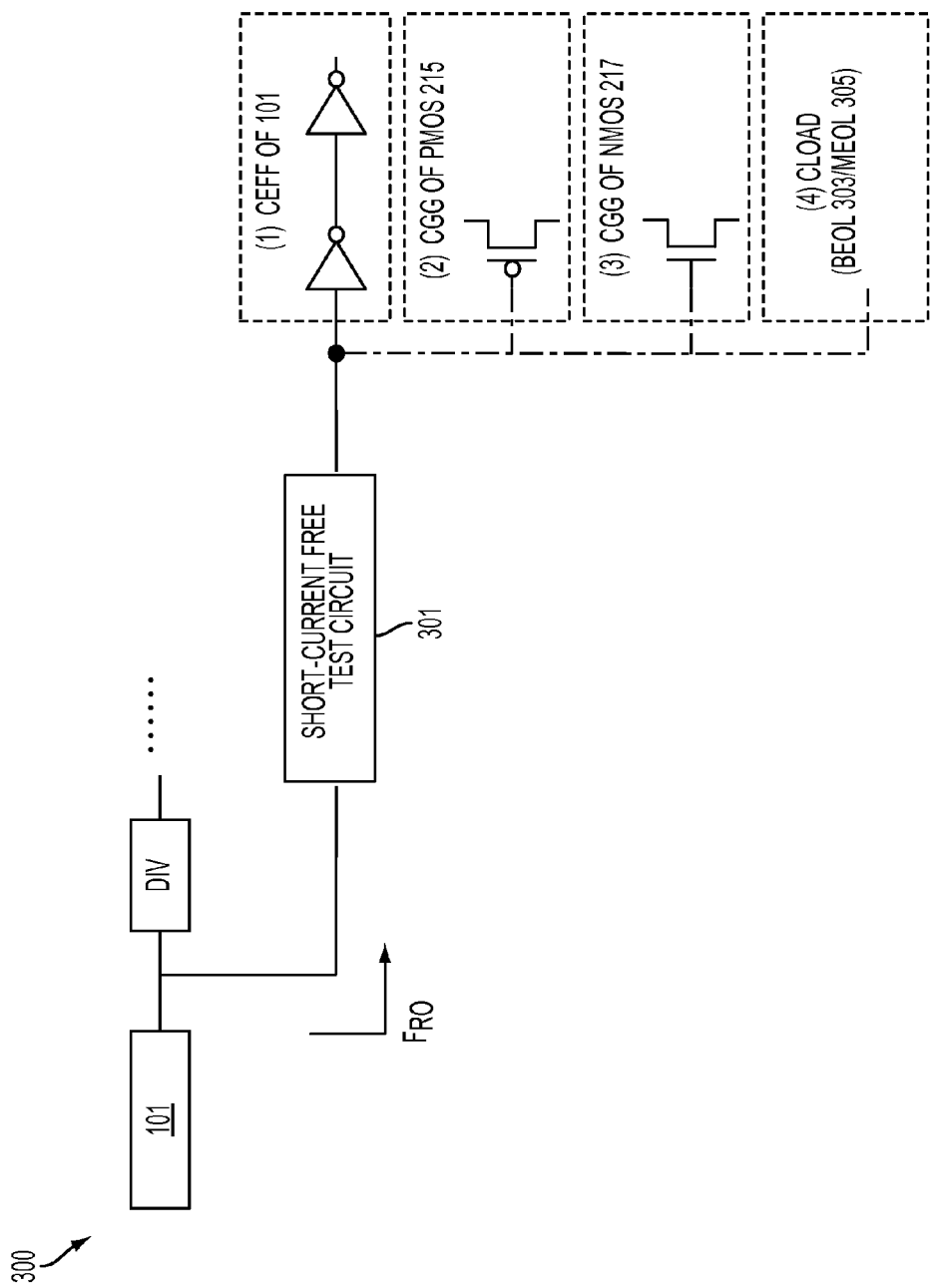
FIG. 3 is a diagram of a test circuit configured to determine a capacitance value for any number of circuit elements, in accordance with one or more embodiments.

FIG. 3 is a diagram of a test circuit 300 configured to determine capacitance values for any number of circuit elements, in accordance with one or more embodiments. In one or more embodiments, a short-current free test circuit 301 that includes a combination of features discussed with respect to test circuit 100 and/or test circuit 200 is readily configurable to determine the capacitance of any circuit element of the combination of circuit elements. For example, the short-current free test circuit 301 is configured to include at least the first communication path 105 that is divided into the second communication path 111 and the third communication path 113 to avoid including short current other than Ix and/or Iy in a capacitance value determination. In some embodiments, depending on a number of circuit elements or a position of circuit elements in the test circuit 300, the short-current free test circuit 301 includes the first communication path 105 divided into any number of communication paths greater than or lesser than the six communication paths (i.e., second communication path 111 through seventh communication path 213) described in test circuit 200.

Accordingly, in some embodiments, the test circuit 300 is configured to determine an effective capacitance Ceff of ring oscillator 101. In some embodiments, the test circuit 300 is configured to determine an input capacitance of the third NMOS transistor 215 and/or the third PMOS transistor 217. In some embodiments, the test circuit 300 is configured to determine a capacitive load of a back-end-of-line circuit element 303 based on the frequency $F_{RO}$, the first voltage Vddx and the first current Ix communicated to the back-end-of-line circuit element 303 along the third communication path 113. In some embodiments, the test circuit 300 is configured to determine a capacitive load of a mid-end-of-line circuit element 305 based on the frequency $F_{RO}$, the first voltage Vddx and the first current Ix communicated to the mid-end-of-line circuit element 305 along the third communication path 113. In one or more embodiments, the back-end-of-line circuit element 303 and the mid-end-of-line circuit element 305 are any circuit element for which a capacitance is determinable.

Figure 4:
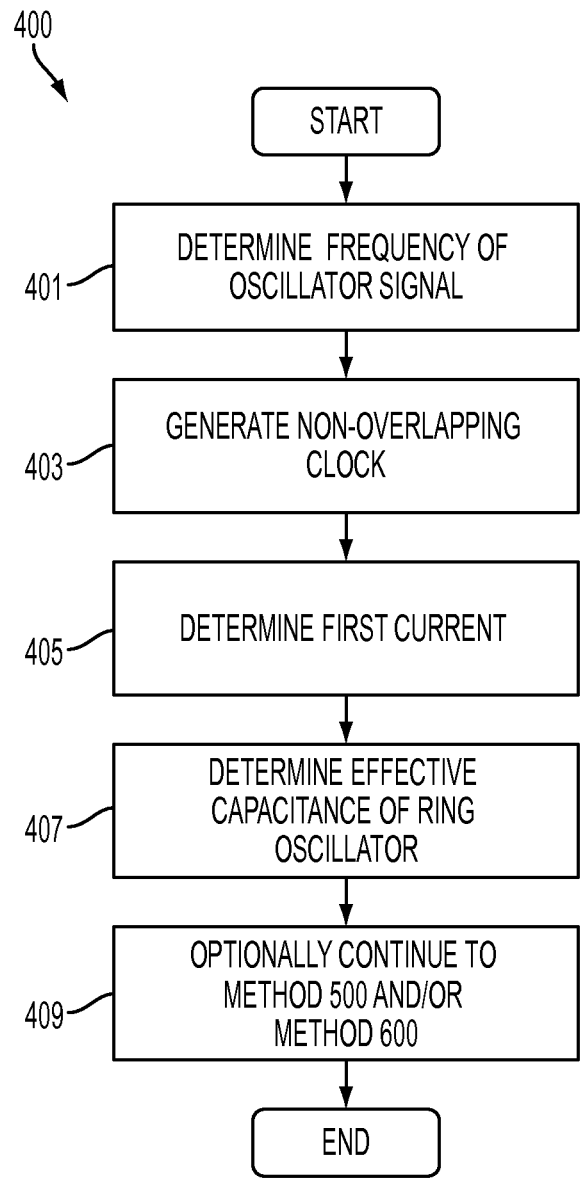
FIG. 4 is a flow chart of a method of determining a capacitance of one or more circuit elements, in accordance with one or more embodiments.

FIG. 4 is a flow chart of a method 400 of determining a capacitance of one or more circuit elements, in accordance with one or more embodiments. Method 400 begins with operation 401 in which a processor, such as processor 107, determines a frequency of an oscillator signal communicated from a ring oscillator to an inverter along a first communication path. In some embodiments, the inverter is a same size as the ring oscillator. In one or more embodiments, the inverter is a device under test inverter configured to facilitate determining a capacitance value associated with one or more devices in addition to the effective capacitance of the ring oscillator.

The first communication path is divided into a second communication path and a third communication path. The second communication path has connectivity to a first voltage source having a first voltage, a first ground path and the inverter. The third communication path has connectivity to the first voltage source having the first voltage, the first ground path and the inverter. In operation 403, a non-overlapping clock is generated to facilitate communicating the oscillator signal along the second communication path and the third communication path. A first in-phase clock signal is communicated along the third communication path and a second out-of-phase clock signal is communicated along the second communication path.

In operation 405, the processor determines a first current associated with the third communication path. In operation 407, the processor determines an effective capacitance of the ring oscillator based on the frequency of the oscillator signal, the first voltage and the first current communicated to the inverter along the third communication path.

In some embodiments, the processor determines an effective capacitance of the ring oscillator excluding a short current based on the relationship:

$$Ceff = Ix/Vddx \cdot F_{RO} \quad [\text{eq. 2}]$$

where Ix is the current associated with the third communication path, Vddx is the voltage of the first voltage source and $F_{RO}$ is the frequency of the oscillator signal.

In operation 409, the method 400 optionally continues to a method 500 and/or a method 600 in which the processor determines a capacitance of one or more circuit elements such as a PMOS transistor, an NMOS transistor, a back-end-of-line circuit element, and a mid-end-of-line circuit element.

Figure 5:
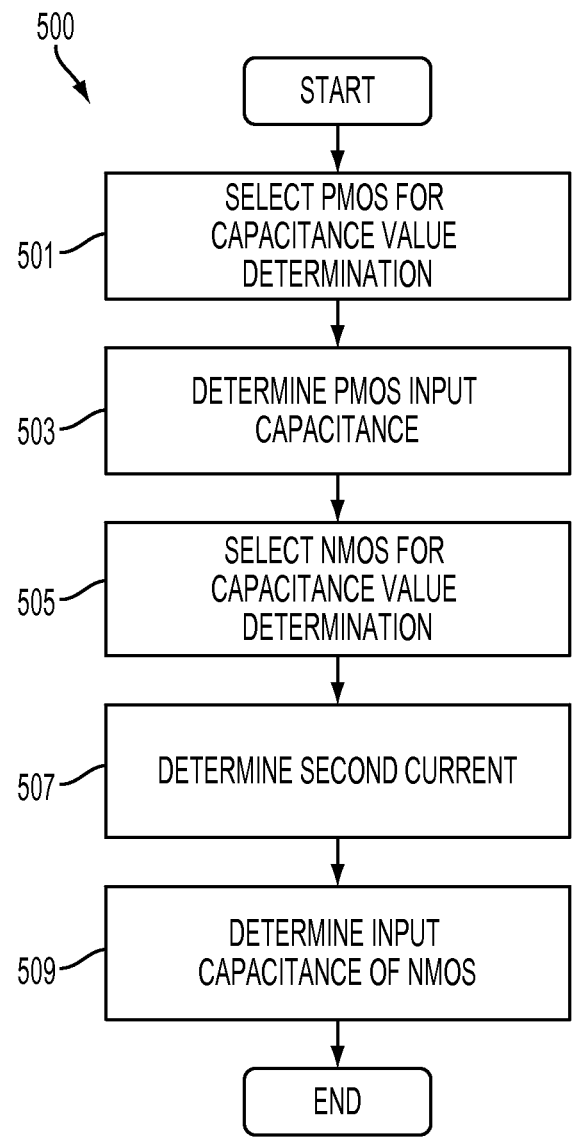
FIG. 5 is a flow chart of a method of determining a capacitance of one or more circuit elements, in accordance with one or more embodiments.

FIG. 5 is a flow chart of a method 500 of determining a capacitance of one or more circuit elements, in accordance with one or more embodiments. Method 500 begins with operation 501 in which the processor executes an instruction to select a PMOS transistor for capacitance value determination. In operation 503, the processor determines an input capacitance of the PMOS transistor based on the frequency of the oscillator signal, the first voltage and the first current communicated to the PMOS transistor along the third communication path.

In operation 505, the processor executes an instruction to select an NMOS transistor for capacitance value determination. The second communication path is divided into a fourth communication path and a fifth communication path. The fourth communication path has connectivity to a second voltage source having a second voltage, a second ground path and the inverter. The fifth communication path having connectivity to the first voltage source having the first voltage, the first ground path and the inverter.

The third communication path is divided into a sixth communication path and a seventh communication path. The sixth communication path has connectivity to the second voltage source having the second voltage, the second ground path and the inverter. The seventh communication path has connectivity to the first voltage source having the first voltage, the first ground path and the inverter. In some embodiments, the sixth communication path and seventh communication path exclude the first ground path and the second ground path.

In operation 507, the processor determines a second current associated with the sixth communication path. In operation 509, the processor determines an input capacitance of the NMOS transistor based on the frequency of the oscillator signal, the second voltage and the second current communicated to the NMOS transistor along the sixth communication path. In some embodiments, the processor determines the input capacitance of the PMOS transistor based on the frequency of the oscillator signal, the first voltage and the first current communicated to the PMOS transistor along the seventh communication path. In some embodiments, the processor determines the input capacitance of the PMOS transistor and the input capacitance of the NMOS transistor input capacitance simultaneously.

Figure 6:
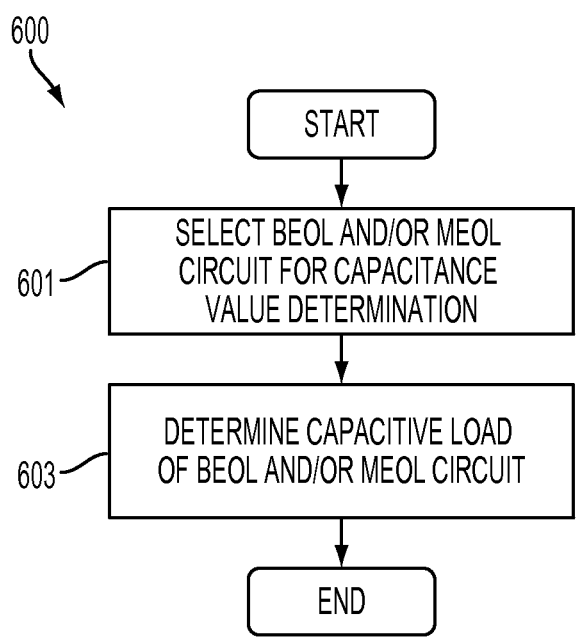
FIG. 6 is a flow chart of a method of determining a capacitance of one or more circuit elements, in accordance with one or more embodiments.

FIG. 6 is a flow chart of a process 600 of determining a capacitance of one or more circuit elements, in accordance with one or more embodiments. The process 600 begins with operation 601 in which the processor executes an instruction to select one or more of a back-end-of-line ("BEOL") circuit element and a mid-end-of-line ("MEOL") circuit element for capacitance value determination. The oscillator signal is communicated along the first communication path and divisions of the first communication path to the back-end-of-line circuit element and/or the mid-end-of line circuit element. In operation 603, the processor determines a capacitive load of the back-end-of-line circuit element and/or the mid-end-of-line circuit element based on the frequency of the oscillator signal, the first voltage and the first current communicated to the back-end-of-line circuit element and/or the mid-end-of-line circuit element along the third communication path.

The processes described herein for determining a capacitance of one or more circuit elements may be advantageously implemented via software, hardware, firmware or a combination of software and/or firmware and/or hardware. For example, the processes described herein, may be advantageously implemented via processor(s), Digital Signal Processing (DSP) chip, an Application Specific Integrated Circuit (ASIC), Field Programmable Gate Arrays (FPGAs), etc. Such exemplary hardware for performing the described functions is detailed below.

FIG. 7 illustrates a chip set or chip 700 upon which or by which an embodiment is implemented. Chip set 700 is programmed to determine a capacitance of one or more circuit elements, as described herein, and includes, for example, bus 701, processor 107, memory 705, DSP 707 and ASIC 709 components.

The processor 107 and memory 705 are incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set 700 are implemented in a single chip. It is further contemplated that in certain embodiments the chip set or chip 700 is implemented as a single "system on a chip." It is further contemplated that in certain embodiments a separate ASIC would not be used, for example, and that all relevant functions as disclosed herein would be performed by a processor or processors, e.g., processor 107. Chip set or chip 700, or a portion thereof, constitutes a mechanism for performing one or more steps of determining a capacitance of one or more circuit elements.

In one or more embodiments, the chip set or chip 700 includes a communication mechanism such as bus 701 for passing information among the components of the chip set 700. Processor 107 has connectivity to the bus 701 to execute instructions and process information stored in, for example, the memory 705. In some embodiments, the processor 107 is also accompanied with one or more specialized components to perform certain processing functions and tasks such as one or more digital signal processors (DSP) 707, or one or more application-specific integrated circuits (ASIC) 709. A DSP 707 typically is configured to process real-world signals (e.g., sound) in real time independently of the processor 107. Similarly, an ASIC 709 is configurable to perform specialized functions not easily performed by a more general purpose processor. Other specialized components to aid in performing the functions described herein optionally include one or more field programmable gate arrays (FPGA), one or more controllers, or one or more other special-purpose computer chips.

In one or more embodiments, the processor (or multiple processors) 107 performs a set of operations on information as specified by computer program code related to determining a capacitance of one or more circuit elements. The computer program code is a set of instructions or statements providing instructions for the operation of the processor and/or the computer system to perform specified functions.

The processor 107 and accompanying components have connectivity to the memory 705 via the bus 701. The memory 705 includes one or more of dynamic memory (e.g., RAM, magnetic disk, writable optical disk, etc.) and static memory (e.g., ROM, CD-ROM, etc.) for storing executable instructions that when executed perform the steps described herein to determine a capacitance of one or more circuit elements. The memory 705 also stores the data associated with or generated by the execution of the steps.

In one or more embodiments, the memory 705, such as a random access memory (RAM) or any other dynamic storage device, stores information including processor instructions for determining a capacitance of one or more circuit elements. Dynamic memory allows information stored therein to be changed by system 100. RAM allows a unit of information stored at a location called a memory address to be stored and retrieved independently of information at neighboring addresses. The memory 705 is also used by the processor 107 to store temporary values during execution of processor instructions. In various embodiments, the memory 705 is a read only memory (ROM) or any other static storage device coupled to the bus 701 for storing static information, including instructions, that is not changed by the system 100. Some memory is composed of volatile storage that loses the information stored thereon when power is lost. In some embodiments, the memory 705 is a non-volatile (persistent) storage device, such as a magnetic disk, optical disk or flash card, for storing information, including instructions, that persists even when the system 100 is turned off or otherwise loses power.

The term "computer-readable medium" as used herein refers to any medium that participates in providing information to processor 107, including instructions for execution. Such a medium takes many forms, including, but not limited to computer-readable storage medium (e.g., non-volatile media, volatile media). Non-volatile media includes, for example, optical or magnetic disks. Volatile media include, for example, dynamic memory. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, an EPROM, a FLASH-EPROM, an EEPROM, a flash memory, any other memory chip or cartridge, or another medium from which a computer can read. The term computer-readable storage medium is used herein to refer to a computer-readable medium.

One aspect of this description relates to a method for determining an effective capacitance of a ring oscillator comprising determining a frequency of an oscillator signal communicated from a ring oscillator to an inverter along a first communication path. The first communication path is divided into a second communication path and a third communication path. The second communication path has connectivity to a first voltage source, a first ground path and the inverter. The third communication path has connectivity to the first voltage source, the first ground path and the inverter. The method further comprises determining a first current associated with the third communication path. The method additionally comprises determining an effective capacitance of the ring oscillator based on a first voltage of the first voltage source, the first current and the frequency of the oscillator signal communicated to the inverter along the third communication path.

Another aspect of this description relates to a test circuit for determining an effective capacitance of a ring oscillator comprising a ring oscillator having an output, the ring oscillator configured to communicate an oscillator signal having a frequency from the output to a first communication path. The test circuit also comprises an inverter configured to receive the oscillator signal. The test circuit further comprises a second communication path having connectivity to a first voltage source, a first ground path and the inverter, the second communication path being a first division of the first communication path. The test circuit additionally comprises a third communication path having connectivity to the first voltage source, the first ground path and the inverter, the third communication path being a second division of the first communication path. The test circuit also comprises a processor configured to determine a first current associated with the third communication path and determine an effective capacitance of the ring oscillator based on a first voltage of the first voltage source, the first current and the frequency of the oscillator signal communicated to the inverter along the third communication path.

Another aspect of this description relates to a test circuit comprising a ring oscillator having an output, the ring oscillator configured to communicate an oscillator signal having a frequency from the output to a first communication path. The test circuit also comprises a plurality of circuit elements configured to receive the oscillator signal. The test circuit further comprises a short-current free test circuit module comprising a second communication path having connectivity to a first voltage source, the first ground path and the plurality of circuit elements, the second communication path being a first division of the first communication path; a third communication path having connectivity to the first voltage source, the first ground path and the plurality of circuit elements, the third communication path being a second division of the first communication path; and a processor configured to determine a first current associated with the third communication path and selectively determine a capacitance value of one or more of the plurality of circuit elements based on a first voltage of the first voltage source, the first current and the frequency of the oscillator signal communicated to the plurality of circuit elements along the third communication path.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. Although features of various embodiments are expressed in certain combinations among the claims, it is contemplated that these features can be arranged in any combination and order. It is therefore intended that the protection granted hereon be limited only by the definition contained in the appended claims and equivalents thereof.

What is claimed is:

1. A method comprising:
   determining a frequency of an oscillator signal communicated from a ring oscillator to an inverter along a first communication path, the first communication path being divided into a second communication path and a third communication path, the second communication path having connectivity to a first voltage source, a first ground path and the inverter, the third communication path having connectivity to the first voltage source, the first ground path and the inverter;
   generating a non-overlapping clock signal to facilitate communicating the oscillator signal along the third communication path and an out-of-phase signal along the second communication path, wherein generation of the out-of-phase signal is independent of the signal communicated along the third communication path;
   determining a first current associated with the third communication path; and
   determining an effective capacitance of the ring oscillator based on a first voltage of the first voltage source, the first current and the frequency of the oscillator signal communicated to the inverter along the third communication path.

2. The method of claim 1,
   wherein the effective capacitance is determined by excluding the out-of-phase signal from the effective capacitance determination.

3. The method of claim 1, wherein the effective capacitance of the ring oscillator is determined excluding a short current based on a relationship:

$$Ceff = Ix/Vddx \cdot F_{RO}$$

wherein Ix is the current associated with the third communication path, Vddx is the first voltage and $F_{Ro}$ is the frequency of the oscillator signal.

4. The method of claim 1, wherein the inverter is a device under test inverter configured to facilitate determining a capacitance value associated with one or more devices in addition to the effective capacitance of the ring oscillator.

5. The method of claim 4, further comprising:
   selecting a PMOS transistor for capacitance value determination; and
   determining an input capacitance of the PMOS transistor based on the first voltage, the first current and the frequency of the oscillator signal communicated to the PMOS transistor along the third communication path.

6. The method of claim 5, further comprising:
   selecting an NMOS transistor for capacitance value determination, the second communication path being divided into a fourth communication path and a fifth communication path, the fourth communication path having connectivity to a second voltage source, a second ground path and the inverter, and the fifth communication path having connectivity to the first voltage source, the first ground path and the inverter, the third communication path being divided into a sixth communication path and a seventh communication path, the sixth communication path having connectivity to the second voltage source, and the second ground path and the inverter, the seventh communication path having connectivity to the first voltage source, the first ground path and the inverter;
   determining a second current associated with the sixth communication path; and
   determining an input capacitance of the NMOS transistor based on a second voltage of the second voltage source, the second current and the frequency of the oscillator signal communicated to the NMOS transistor along the sixth communication path;
   wherein the input capacitance of the PMOS transistor is determined based on the first voltage, the first current and the frequency of the oscillator signal communicated to the PMOS transistor along the seventh communication path.

7. The method of claim 6, wherein the PMOS transistor input capacitance and NMOS transistor input capacitance are determined simultaneously.

8. The method of claim 1, further comprising:
   selecting a back-end-of-line circuit element for capacitance value determination; and
   determining a capacitive load of the back-end-of-line circuit element based on the first voltage, the first current and the frequency of the oscillator signal communicated to the back-end-of-line circuit element along the third communication path.

9. The method of claim 1, further comprising:
   selecting a mid-end-of-line circuit element for capacitance value determination; and
   determining a capacitive load of the mid-end-of-line circuit element based on the first voltage, the first current and the frequency of the oscillator signal communicated to the mid-end-of-line circuit element along the third communication path.

10. A test circuit comprising:
    a ring oscillator having an output, the ring oscillator configured to communicate an oscillator signal having a frequency from the output to a first communication path;
    an inverter configured to receive the oscillator signal;
    a second communication path having connectivity to a first voltage source, a first ground path and the inverter, the second communication path being a first division of the first communication path;
    a third communication path having connectivity to the first voltage source, the first ground path and the inverter, the third communication path being a second division of the first communication path;
    a non-overlapping clock generator configured to facilitate communicating the oscillator signal along the third communication path and an out-of-phase signal along the second communication path, wherein generation of the out-of-phase signal is independent the signal communicated along the third communication path; and
    a processor configured to determine a first current associated with the third communication path and determine an effective capacitance of the ring oscillator based on a first voltage of the first voltage source, the first current and the frequency of the oscillator signal communicated to the inverter along the third communication path.

11. The test circuit of claim 10,
    wherein the processor is further configured to determine the effective capacitance by excluding the out-of-phase signal from the effective capacitance determination.

12. The test circuit of claim 10, wherein the processor is configured to determine the effective capacitance of the ring oscillator excluding a short current based on a relationship:

$$Ceff = Ix/Vddx \cdot F_{RO}$$

wherein Ix is the current associated with the third communication path, Vddx is the first voltage and $F_{RO}$ is the frequency of the oscillator signal.

13. The test circuit of claim 10, wherein the inverter is a device under test inverter configured to facilitate determining a capacitance value associated with one or more devices in addition to the effective capacitance of the ring oscillator.

14. The test circuit of claim 13, further comprising:
a PMOS transistor, the processor further being configured to determine an input capacitance of the PMOS transistor,
wherein the input capacitance of the PMOS transistor is based on the first voltage, the first current and the frequency of the oscillator signal communicated to the PMOS transistor along the third communication path.

15. The test circuit of claim 14, further comprising:
an NMOS transistor, the processor further being configured to determine an input capacitance of the NMOS transistor;
a fourth communication path having connectivity to a second voltage source, a second ground path and the inverter, the fourth communication path being a first division of the second communication path;
a fifth communication path having connectivity to the first voltage source, the first ground path and the inverter, the fifth communication path being a second division of the second communication path;
a sixth communication path having connectivity to the second voltage source, the second ground path and the inverter, the sixth communication path being a first division of the third communication path; and
a seventh communication path having connectivity to the first voltage source, the first ground path and the inverter, the seventh communication path being a second division of the third communication path,
wherein the processor is further configured to
determine a second current associated with the sixth communication path,
determine the input capacitance of the NMOS transistor based on a second voltage of the second voltage source, the second current and the frequency of the oscillator signal communicated to the NMOS transistor along the sixth communication path, and
determine the input capacitance of the PMOS transistor based on the first voltage, the first current and the frequency of the oscillator signal communicated to the PMOS transistor along the seventh communication path.

16. The test circuit of claim 15, wherein the processor is further configured to determine the input capacitance of the PMOS transistor input capacitance and the input capacitance of the NMOS transistor simultaneously.

17. The test circuit of claim 10, further comprising:
a back-end-of-line circuit element configured to receive the oscillator signal communicated along the first communication path,
wherein the processor is further configured to determine a capacitive load of the back-end-of-line circuit element based on the first voltage, the first current and the frequency of the oscillator signal communicated to the back-end-of-line circuit element along the third communication path.

18. The test circuit of claim 10, further comprising:
a mid-end-of-line circuit element configured to receive the oscillator signal communicated along the first communication path,
wherein the processor is further configured to determine a capacitive load of the mid-end-of-line circuit element based on the first voltage, the first current and the frequency of the oscillator signal communicated to the mid-end-of-line circuit element along the third communication path.

19. A test circuit comprising:
a ring oscillator having an output, the ring oscillator configured to communicate an oscillator signal having a frequency from the output to a first communication path;
a plurality of circuit elements configured to receive the oscillator signal;
a short-current free test circuit module comprising:
a second communication path having connectivity to a first voltage source, the first ground path and the plurality of circuit elements, the second communication path being a first division of the first communication path;
a third communication path having connectivity to the first voltage source, the first ground path and the plurality of circuit elements, the third communication path being a second division of the first communication path;
a non-overlapping clock generator configured to facilitate communicating the oscillator signal along the third communication path and an out-of-phase signal along the second communication path, wherein generation of the out-of-phase signal is independent the signal communicated along the third communication path; and
a processor configured to determine a first current associated with the third communication path and selectively determine a capacitance value of one or more of the plurality of circuit elements based on a first voltage of the first voltage source, the first current and the frequency of the oscillator signal communicated to the plurality of circuit elements along the third communication path.

20. The test circuit of claim 19,
wherein the processor is further configured to determine the effective capacitance by excluding the out-of-phase signal from the effective capacitance determination.

* * * * *